US010515039B2

United States Patent
Stenger et al.

(10) Patent No.: US 10,515,039 B2
(45) Date of Patent: Dec. 24, 2019

(54) VEHICLE USB HUB SYSTEM

(71) Applicant: Molex, LLC, Lisle, IL (US)

(72) Inventors: Joseph D. Stenger, Woodbury, MN (US); Robert Sosack, Bartlett, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/240,270

(22) Filed: Jan. 4, 2019

(65) Prior Publication Data

US 2019/0213157 A1 Jul. 11, 2019

Related U.S. Application Data

(60) Provisional application No. 62/613,929, filed on Jan. 5, 2018.

(51) Int. Cl.
G06F 13/38 (2006.01)
H03M 13/09 (2006.01)
H04W 4/48 (2018.01)
G07C 5/00 (2006.01)

(52) U.S. Cl.
CPC ........... *G06F 13/385* (2013.01); *G07C 5/008* (2013.01); *H03M 13/09* (2013.01); *H04W 4/48* (2018.02); *G06F 2213/0042* (2013.01); *G06F 2213/3812* (2013.01)

(58) Field of Classification Search
CPC ........ G06F 13/385; H04W 4/48; G07C 5/008; H03M 13/09
USPC ....................................................... 710/105
See application file for complete search history.

(56) References Cited

U.S. PATENT DOCUMENTS

| 5,444,716 A * | 8/1995 | Jarwala .......... G01R 31/318566 714/727 |
| 6,760,333 B1 * | 7/2004 | Moody ................. H04L 12/403 370/395.1 |
| 7,881,816 B2 * | 2/2011 | Mathiesen ......... G05B 19/4185 340/12.54 |
| 8,719,925 B1 * | 5/2014 | Berg ..................... G06F 21/566 726/22 |
| 9,444,892 B1 * | 9/2016 | Amireddy ............ H04W 76/10 |
| 10,380,049 B2 * | 8/2019 | Lin ........................ G06F 13/385 |
| 2002/0034178 A1 * | 3/2002 | Schmidt ............ H04L 29/12009 370/386 |
| 2002/0194524 A1 * | 12/2002 | Wiley ................... H04L 1/0061 714/4.5 |
| 2005/0171721 A1 * | 8/2005 | Patterson .......... B60W 50/0205 702/122 |

(Continued)

OTHER PUBLICATIONS

Universal Serial Bus 3.0 Specification Revision 1.0 Nov. 12, 2008 (Year: 2008).*

*Primary Examiner* — Paul R. Myers

(74) *Attorney, Agent, or Firm* — Molex, LLC

(57) ABSTRACT

A vehicle USB hub system that includes a USB hub, a controller and memory unit is provided. The vehicle USB hub system collects data link quality metrics for messaging to and within a vehicle. The USB hub has a CRC error detector for detecting CRC errors in messaging received via its ports. Information regarding detected CRC errors is stored in the memory unit. The controller generates a CRC error log using the information stored in the memory unit upon receiving an indication that an error log should be sent. The controller then sends the CRC error log to a device via the USB hub port indicated.

14 Claims, 2 Drawing Sheets

(56) References Cited

U.S. PATENT DOCUMENTS

| | | | | |
|---|---|---|---|---|
| 2006/0026487 | A1* | 2/2006 | Tamura | H04N 5/4401 |
| | | | | 714/758 |
| 2009/0063922 | A1* | 3/2009 | Gower | G06F 11/1008 |
| | | | | 714/746 |
| 2009/0313411 | A1* | 12/2009 | Stenfort | G06F 11/1004 |
| | | | | 710/306 |
| 2010/0083060 | A1* | 4/2010 | Rahman | H04L 1/0061 |
| | | | | 714/704 |
| 2011/0138261 | A1* | 6/2011 | Bains | G06F 11/1016 |
| | | | | 714/800 |
| 2016/0357665 | A1* | 12/2016 | Lee | G06F 12/0246 |
| 2018/0212796 | A1* | 7/2018 | Kamihara | G06F 13/4022 |

* cited by examiner

VEHICLE USB HUB SYSTEM

RELATED APPLICATIONS

This application claims priority to U.S. Provisional Application No. 62/613,929, filed Jan. 5, 2018, which is incorporated herein by reference in its entirety.

TECHNICAL FIELD

This disclosure relates to the field of USB (Universal Serial Bus) Hub systems.

DESCRIPTION OF RELATED ART

This section introduces aspects that may help facilitate a better understanding of the inventions. Accordingly, the statements of this section are to be read in this light and are not to be understood as admissions about what is prior art or what is not prior art.

Currently, a majority of customer failure returns of vehicle USB Media modules are classified as TNI (trouble not identified). This means those modules were removed from a vehicle and shipped back to the manufacturer/supplier for no identifiable reason, resulting in costs to the manufacturer/supplier's customers for dealer service, and to the manufacturer/supplier for replacement parts and for time to evaluate the returns. Additionally, in-vehicle network connectivity data link quality management, testing and diagnostics is very time consuming and costly. The ECM (electronic control modules) and cable harnesses are generally concealed within the body of the vehicle where accessibility is nearly impossible (if not impossible) without disassembly of parts of the vehicle. Given the dramatic increase of electronic content and in-vehicle networks, these types of problems are only growing.

Identifying the malfunctioning electronic module is generally possible through system error faults. However, identifying the exact failure mode can be more difficult as faults can be attributed to a module when, in fact, the faults were caused by a cable, or vice-versa. For example, if a cable is broken within a vehicle, or otherwise compromised such that the signal quality is not sufficient, the lack of USB signals being successfully transmitted to the Headunit could be blamed on the Media Module. Or, alternatively, if a user supplied cable is similarly lacking in quality or is otherwise compromised (such as using a cheap after-market cable), a similar outcome could occur. Both of these instances would result in the module being removed from the vehicle and returned to the manufacturer/supplier. Having the ability to access the signal error rates on different module ports would allow for better isolation of the problem and reduce the instances the modules are incorrectly removed from the vehicle.

BRIEF DESCRIPTION OF THE DRAWINGS

The present disclosure is illustrated by way of example and not limited in the accompanying figure in which.

Specific embodiments of the present invention are disclosed below with reference to various figures and sketches. Both the description and the illustrations have been drafted with the intent to enhance understanding. For example, the dimensions of some of the figure elements may be exaggerated relative to other elements, and well-known elements that are beneficial or even necessary to a commercially successful implementation may not be depicted so that a less obstructed and a more clear presentation of embodiments may be achieved.

Simplicity and clarity in both illustration and description are sought to effectively enable a person of skill in the art to make, use, and best practice the present invention in view of what is already known in the art. One of skill in the art will appreciate that various modifications and changes may be made to the specific embodiments described below without departing from the spirit and scope of the present invention. Thus, the specification and drawings are to be regarded as illustrative and exemplary rather than restrictive or all-encompassing, and all such modifications to the specific embodiments described below are intended to be included within the scope of the present invention.

DETAILED DESCRIPTION

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

The present disclosure describes the dynamic collection and processing of Data Link quality metrics within a USB Hub System. Standard Hubs contain CRC (cyclic redundancy check) packet error detection for determining if the data received was corrupted during transmission. The notification of the existence of a CRC error is transmitted to the host system (contained within the Vehicle Infotainment system in the present example), such that the host can request that the original transmitting device retransmit the data.

While the Host could be used to collect development quality metrics within the Infotainment Headunit, this additional complexity is not a part of most customers' systems. These customers (typically original equipment manufacturers (OEMs)) are extremely sensitive to modification to their existing software for their Infotainment Headunits and, therefore, manufacturers/suppliers may be looking for ways to provide this value in their products and to reduce the barriers to the solution on the customer's side.

Figure 1:
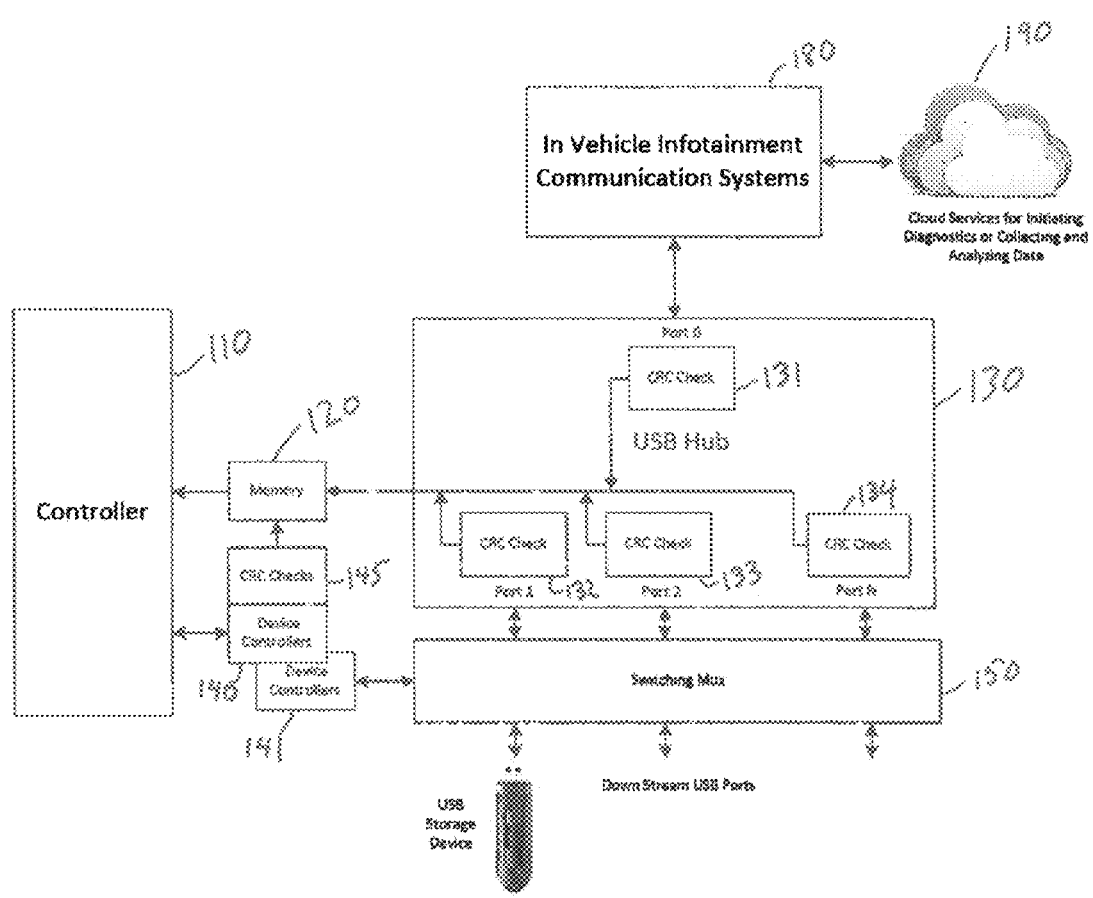
FIG. 1 illustrates a functional block diagram in accordance with some specific embodiments of the present invention.

One approach to achieving the foregoing, with reference to FIG. 1, is to integrate error counters and packet counters 131-134 with the USB Hub 130 within media modules. These CRC error counters 131-134 would store data within a memory block 120 that could be accessed by a controller block 110. This controller block 110 would compile an error log. Then the controller block 110 would generate USB packets to transmit the error log to the Infotainment Headunit 180 through a USB Device (140-141, e.g.) connected to one of the Downstream ports of the USB Hub 130 connected to the Infotainment Headunit 180. These CRC checks are done in other systems, but the metrics are not saved for future analysis. Therefore, any USB devices (140-141, e.g.) connected to the controller 110 and also connected to any one of the USB Hub ports, or external ports, could also detect CRCs and provide that information to the controller 110. As discussed, the error log would be transmitted to the Infotainment system 180 where it could be provided to a cloud-based diagnostic service 190 along with other diagnostic data, or it could be accumulated in a larger log file to be downloaded from the System at any time in the future or a variety of other means of providing the data to technicians, engineers, or others could be employed.

As an alternative implementation, a switching matrix 150 (digital or analog Multiplexer) could be connected between all of the USB downstream ports, the external facing USB device ports, and the internal USB devices (140-141, e.g.) connected to the controller 110. This switching matrix 150 would allow the controller 110 to connect upstream through any of the plurality of USB Hub ports, or downstream through any of the plurality of downstream ports.

As another alternative implementation, there could be a plurality of USB Devices connected (140-141, e.g.) to the controller 110 and this plurality of devices could be connected to any of the plurality of upstream and/or downstream ports.

As another alternative implementation, the USB devices (140-141, e.g.) connected to the controller could be an OTG (On The Go) Device that would enable the device and any port it is connected to, to be a Host or a Device in the USB System.

As another alternative implementation, the data log file could be transmitted through the downstream ports to a storage device or a computer device.

Figure 2:
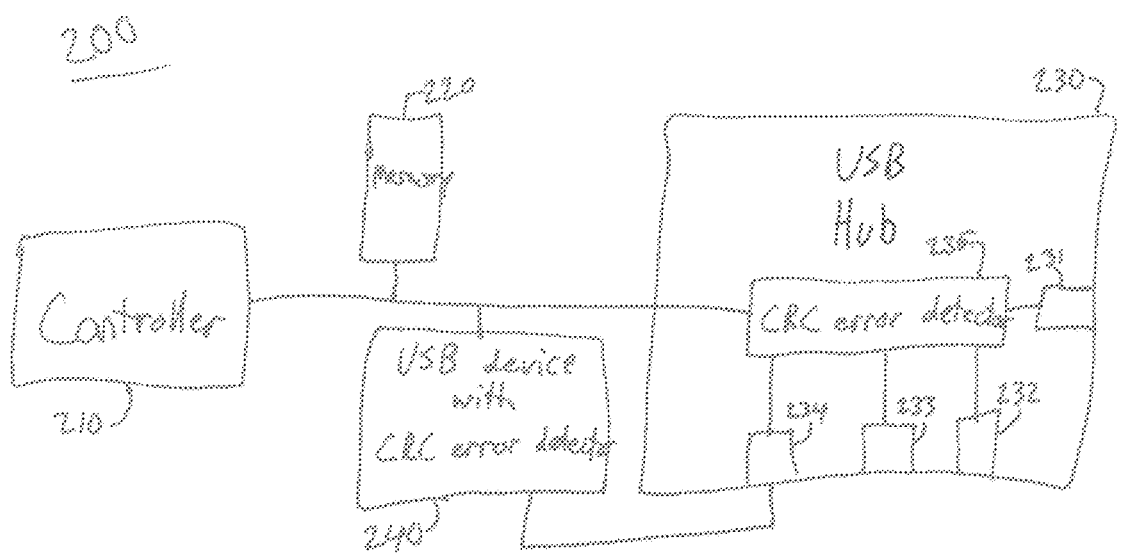
FIG. 2 illustrates a functional block diagram in accordance with various embodiments of the present invention.

Embodiments of the present disclosure are captured more generally in FIG. 2. A vehicle USB hub system 200 that includes a USB hub 230, a controller 210 and memory unit 220 is depicted. Generally speaking, the vehicle USB hub system 200 collects data link quality metrics for messaging to the host vehicle and within the host vehicle. The USB hub 230 has a CRC error detector 235 for detecting CRC errors in messaging received via one or more of its ports (231-234, e.g.). USB hub 230 may include additional CRC error detectors corresponding to individual ports or CRC error detector 235 may serve multiple ports. Information regarding detected CRC errors is stored in the memory unit 220. This information may include the number of packets with CRC errors detected, the number of packets without CRC errors, the total number of packets received in a given period of time or for a given connection, timestamp information, a packet error rate or other data link quality metrics.

Depending on the embodiment, the given CRC error detector may store the information regarding detected CRC errors in the memory unit or the given CRC error detector may indicate the information to the controller and the controller stores the information regarding detected CRC errors in the memory unit. Upon receiving an indication that an error log should be sent, the controller 210 generates a CRC error log using the information stored in the memory unit. The controller 210 then sends the CRC error log to a device via the USB hub port indicated. This device may be a headunit for the host vehicle, which is coupled to the USB hub port indicated. The headunit may be in communication (perhaps via a wireless connection) with a vehicle diagnostic service, such as a cloud-based vehicle diagnostic service. The indication that an error log should be sent may be originated by the headunit, the vehicle diagnostic service or some other device communicatively coupled to the controller 210.

The vehicle USB hub system 200 may also include a USB device 240 communicatively coupled to the controller 210 and to a port (234, e.g.) of the USB hub, the USB device 240 having a CRC error detector configured to detect CRC errors in messaging received via the port. The USB device 240 is also communicatively coupled to the memory unit 220. Depending on the embodiment, the USB device CRC error detector may store information regarding detected CRC errors in the memory unit or the given CRC error detector may indicate the information to the controller and the controller stores the information regarding detected CRC errors in the memory unit.

In general, a controller described herein can be an electronic controller that operates in a logical fashion to perform operations, execute control algorithms, store and retrieve data and other desired operations. It can include or access memory, secondary storage devices, processors, and any other components for running an application. The memory and secondary storage devices can be in the form of read-only memory (ROM), random access memory (RAM) or integrated circuitry that is accessible by the controller. The controller 210 may be a single controller or may include more than one controller disposed to control various functions and/or features. The term "controller" is meant to be used in its broadest sense to include one or more controllers, state machines, and/or microprocessors that may be associated with the vehicle USB hub system or media module. The functionality of the controller 210 can be implemented in hardware and/or software, without regard to the functionality, and the memory unit 220 may physically be combined with the controller 210. Thus, controller 210 and memory unit 220 may be implemented as an application-specific integrated circuit (ASIC). Additionally, some or all aspects of USB device 240 and/or USB hub 230 may be implemented as part of such an ASIC.

Benefits, other advantages, and solutions to problems have been described above with regard to specific embodiments of the present invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

As used herein and in the appended claims, the term "comprises," "comprising," or any other variation thereof is intended to refer to a non-exclusive inclusion, such that a process, method, article of manufacture, or apparatus that comprises a list of elements does not include only those elements in the list, but may include other elements not expressly listed or inherent to such process, method, article of manufacture, or apparatus. The terms a or an, as used herein, are defined as one or more than one. The term plurality, as used herein, is defined as two or more than two. The term another, as used herein, is defined as at least a second or more. Unless otherwise indicated herein, the use of relational terms, if any, such as first and second, top and bottom, and the like are used solely to distinguish one entity or action from another entity or action without necessarily requiring or implying any actual such relationship or order between such entities or actions.

The terms including and/or having, as used herein, are defined as comprising (i.e., open language). The term coupled, as used herein, is defined as connected, although not necessarily directly, and not necessarily mechanically. The use of "or" or "and/or" herein is defined to be inclusive (A, B or C means any one or any two or all three letters) and not exclusive (unless explicitly indicated to be exclusive); thus, the use of "and/or" in some instances is not to be interpreted to imply that the use of "or" somewhere else means that use of "or" is exclusive. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

What is claimed is:

1. A vehicle USB hub system comprising:
   a USB hub having a plurality of ports and at least one CRC (cyclic redundancy check) error detector configured to detect CRC errors in messaging received via at least one of the plurality of ports;
   a controller communicatively coupled to the USB hub;
   a memory unit communicatively coupled to the controller and configured to store information regarding detected CRC errors, the controller being configured to generate a CRC error log using the information stored in the memory unit upon receiving an indication that an error log should be sent via a USB hub port of the plurality of ports, and the controller being configured to send the CRC error log to a device via the USB hub port.

2. The vehicle USB hub system as recited in claim 1, wherein the information regarding detected CRC errors comprises an indication of a number of packets received.

3. The vehicle USB hub system as recited in claim 1, wherein the memory unit is communicatively coupled to the USB hub and wherein the at least one CRC error detector is further configured to store information regarding detected CRC errors in the memory unit.

4. The vehicle USB hub system as recited in claim 1, wherein the at least one CRC error detector is further configured to indicate to the controller information regarding detected CRC errors and wherein the controller is further configured to store information regarding detected CRC errors in the memory unit.

5. The vehicle USB hub system as recited in claim 1, wherein the device is a vehicle headunit.

6. The vehicle USB hub system as recited in claim 1, wherein the controller being configured to send the CRC error log to a device comprises the controller being configured to send the CRC error log to a device for transmission to a cloud-based diagnostic service.

7. The vehicle USB hub system as recited in claim 1, further comprising a USB device communicatively coupled to the controller and to a port of the plurality of ports of the USB hub, the USB device having a CRC error detector configured to detect CRC errors in messaging received via the port of the plurality of ports.

8. The vehicle USB hub system as recited in claim 7, wherein the memory unit is communicatively coupled to the USB device and wherein the CRC error detector of the USB device is further configured to store information regarding detected CRC errors in the memory unit.

9. The vehicle USB hub system as recited in claim 7, wherein the at least one CRC error detector is further configured to indicate to the controller information regarding detected CRC errors and wherein the controller is further configured to store information regarding detected CRC errors in the memory unit.

10. The vehicle USB hub system as recited in claim 7, further comprising a switching matrix communicatively coupled to the controller and to some of the ports of the plurality of ports of the USB hub, wherein the USB device is communicatively coupled to the port via the switching matrix.

11. The vehicle USB hub system as recited in claim 7, wherein the information regarding detected CRC errors comprises an indication of a number of packets received.

12. The vehicle USB hub system as recited in claim 1, further comprising a vehicle headunit coupled to a port of the plurality of ports of the USB hub.

13. The vehicle USB hub system as recited in claim 12, wherein the vehicle headunit is configured to be communicatively coupled to a vehicle diagnostic service.

14. The vehicle USB hub system as recited in claim 13, wherein the vehicle diagnostic service is a cloud-based vehicle diagnostic service and wherein the vehicle headunit being configured to be communicatively coupled to the vehicle diagnostic service comprises the vehicle headunit being configured to be in communication via a wireless connection with the vehicle diagnostic service.

* * * * *